US006285369B1

(12) United States Patent
Kross et al.

(10) Patent No.: US 6,285,369 B1
(45) Date of Patent: *Sep. 4, 2001

(54) ELECTRONIC NOTEBOOK FOR MAINTAINING DESIGN INFORMATION

(75) Inventors: Robert L. Kross, West Linn, OR (US); Amy B. Wagreich, San Diego, CA (US); Guri A. Stark, Novato, CA (US); David L. Gill, San Diego, CA (US); David G. Comfort, Encinitas, CA (US); William E. Bogan, Lakeside, CA (US)

(73) Assignee: Autodesk, Inc., San Rafael, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/076,752

(22) Filed: May 12, 1998

(51) Int. Cl.[7] ................................................. G06F 15/00
(52) U.S. Cl. ............................................................. 345/419
(58) Field of Search ............................ 345/418, 419, 345/420, 421, 435, 113, 114

(56) References Cited

U.S. PATENT DOCUMENTS

| 5,526,478 | 6/1996 | Russell, Jr. et al. | 395/154 |
| 5,551,028 | 8/1996 | Voll et al. | 395/600 |
| 5,708,764 | 1/1998 | Borrel et al. | 395/119 |

FOREIGN PATENT DOCUMENTS

| PCT/US96/ 14299 | 10/1996 | (WO) . |

OTHER PUBLICATIONS

"Engineering Office Version 1.0", Products and Solutions, Renderview Software, Inc. 4 pages 1998.
"Release Notes", Products and Solutions, Renderview Software, Inc., 2 pages 1998.
"PC–based CAE tools—facilitate creation of technical documents," EDN–Electronic Design News, Dec. 8, 1988, No. 25, Part I, Newton, MA, USA.

*Primary Examiner*—Phu K. Nguyen
(74) *Attorney, Agent, or Firm*—Columbia IP Law Group, PC

(57) ABSTRACT

A method and apparatus for maintaining design information corresponding to a design. In one embodiment, an electronic notebook for maintaining design information maintains information corresponding to a design, and follows the steps of receiving a request to add note information corresponding to the design, and automatically copying, in response to the request, at least a portion of the design to a note of the electronic notebook. As a result, detailed design information such as, but not limited to, design intent and design history is maintained throughout the development and manufacturing of the design, as well as other information if desired, for the design.

30 Claims, 8 Drawing Sheets

ELECTRONIC NOTEBOOK FOR MAINTAINING DESIGN INFORMATION

BACKGROUND OF THE INVENTION

1. Field of the Invention

The present invention pertains to the field of data storage. More particularly, this invention relates to maintaining design information.

2. Background

As technology has advanced, computer systems have become more and more commonplace in a wide variety of home and business environments. One use of such computer systems is for computer aided design (CAD) programs, which allow users to design various products in varying degrees of detail. Although modern CAD programs provide excellent drawing capabilities, their ability to track the design intent of the designer(s) as well as the history of a design are virtually nonexistent.

One solution to this problem is for the user to manually document the design intent and history in a separate text document, such as by using a word processor or text editor. However, this solution does not allow the text document and the corresponding design to be linked. In other words, there is no direct indication in the design of which portions of the design are further discussed in the separate text document.

Solutions to similar problems in other application areas include, for example, the ability provided by some word processors for a user to insert comments into a text document. An indication of where these comments occur within the text is typically displayed to the user (e.g., a comment number or high-lighting of a portion of the text). However, one problem with such comments is that they must accompany the underlying document. That is, there is typically no ability to view the comments separately from the underlying document. Another problem with such comments is that their content is typically only that which is manually entered by the user. That is, there is typically no ability to automatically enter portion(s) of an underlying document into the comments.

Another solution in other application areas includes the ability to link and/or embed documents into a word processing document, generally referred to as "OLE" (object linking and embedding). However, problems similar to those with comments exist with OLE, such as the linking and/or embedding having to be done manually by the user. Similarly, OLE limits a user to inputting only a single representation or view of a document (e.g., the first few cells of data from a spreadsheet) into the word processing document—multiple views are not possible.

Thus, a need exists for an improved way to track design intent and design history.

SUMMARY OF THE INVENTION

An electronic notebook for maintaining design information is described herein. The electronic notebook maintains information corresponding to a design, following the steps of receiving a request to add note information corresponding to the design, and automatically copying, in response to the request, at least a portion of the design to a note of the electronic notebook.

According to one embodiment of the present invention, in response to the request, primary design information is automatically added to the note. Additionally, in this embodiment, secondary design information can be added to the note by the user.

According to one embodiment of the present invention, primary or secondary design information added to a note includes one or more of text data, audio data, and video data.

According to one embodiment of the present invention, at least a portion of the design added to the note is a "snapshot" of the current state of the design.

According to one embodiment of the present invention, at least a portion of the design added to the note is a dynamic object which is updated, each time the note is accessed, in order to reflect the most recent state of the design.

According to one embodiment of the present invention, multiple views of a design can be included within a single note.

BRIEF DESCRIPTION OF THE DRAWINGS

The present invention is illustrated by way of example and not limitation in the figures of the accompanying drawings, in which like references indicate similar elements and in which.

DETAILED DESCRIPTION

In the following detailed description numerous specific details are set forth in order to provide a thorough understanding of the present invention. However, it will be understood by those skilled in the art that the present invention may be practiced without these specific details. In other instances well known methods, procedures, components, and circuits have not been described in detail so as not to obscure the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Figure 1A:
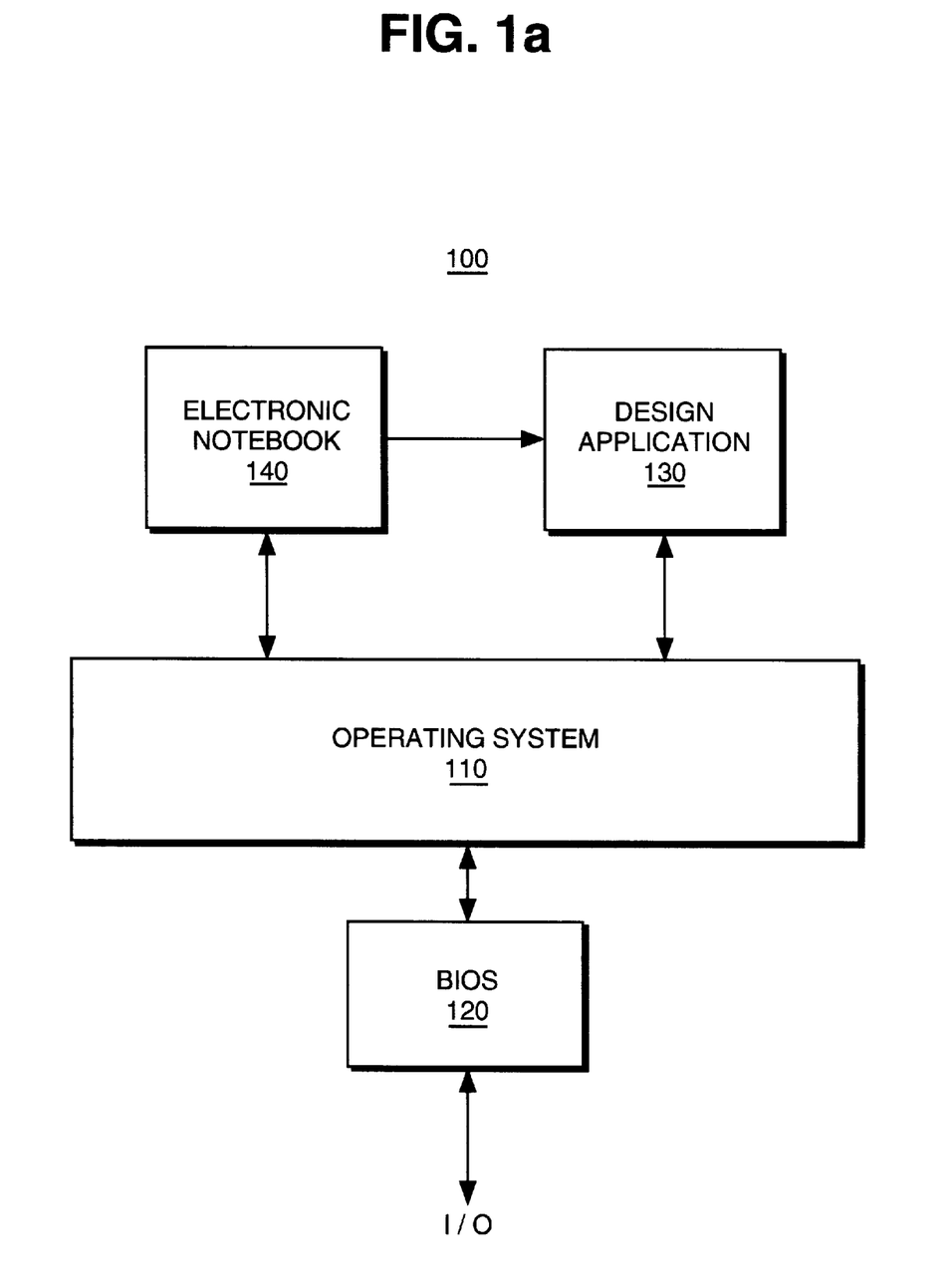
FIG. 1a is a simplified block diagram illustrating an example computer system architecture including an electronic notebook according to one embodiment of the present invention.

FIG. 1a is a simplified block diagram illustrating an example computer system architecture including an electronic notebook according to one embodiment of the present invention. As illustrated, system architecture 100 includes an operating system 110, a basic input output system (BIOS) 120, a design application 130, and an electronic notebook 140 of the present invention.

Figure 1B:
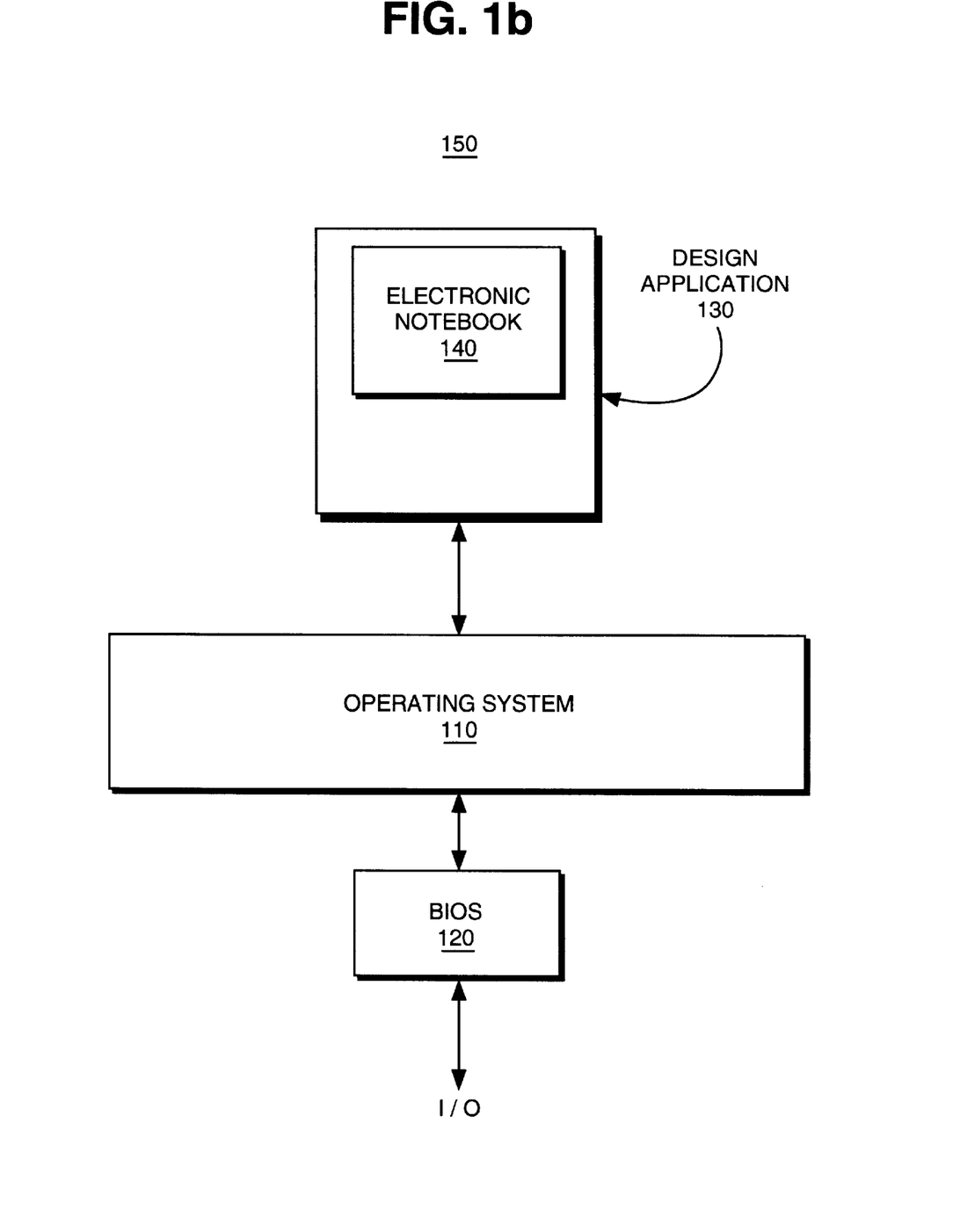
FIG. 1b is a simplified block diagram illustrating an example computer system architecture including an electronic notebook according to another embodiment of the present invention.

FIG. 1b is a simplified block diagram illustrating an example computer system architecture including an electronic notebook according to another embodiment of the present invention. As illustrated, system architecture 150 includes operating system 110, BIOS 120, design application 130, and electronic notebook 140, each of which performs the same functions as in system architecture 100. However, system architecture 150 of FIG. 1b differs from system architecture 100 of FIG. 1a in that electronic notebook 140 is incorporated into and operates as part of design application 130, rather than as a standalone application.

BIOS 120 provides an interface between operating system 110 and the various input/output (I/O) devices coupled to the system. Operating system 110 is a software application which provides an interface between BIOS 120 and software applications such as electronic notebook 140 and design application 130. It is to be appreciated that additional applications (not shown) may also be executed under the control of operating system 110. Operating system 110 provides an interface, such as a graphical user interface (GUI), between the user and the applications executing on the computer system. According to one embodiment of the present invention, operating system 110 is the Windows™ 95 operating system, available from Microsoft Corporation of Redmond, Wash. However, it is to be appreciated that the present invention may be used with any other conventional operating system, such as other versions of Microsoft Windows™ (for example, Windows™ 3.0, Windows™ 3.1, Windows™ NT, or Windows™ CE) or Microsoft DOS, OS/2, available from International Business Machines Corporation of Armonk, N.Y., or the Apple Macintosh Operating System, available from Apple Computer Incorporated of Cupertino, Calif. It is also to be appreciated that in alternate embodiments various portions of operating system 110 can be implemented in hardware and/or firmware.

Design application 130 is intended to represent any of a wide variety of commercially available applications to assist a user in the design of something, such as a product (mechanical and/or electrical), a structure (e.g., a house or office building), computer software, etc. According to one implementation, design application 130 is a computer-aided design (CAD) program, such as one of the AutoCAD® or Mechanical Desktop® family of software applications available from Autodesk, Inc. of San Rafael, Calif. However, in alternate implementations design application 130 can be other design products, such as a circuit design and/or simulation program, software development environment, etc. It is to be appreciated that the specific functions provided by design application 130 are dependent on the specific software application being used.

Electronic notebook 140 of the present invention is an application used to maintain design information for designs created by another application, such as design application 130. Electronic notebook 140 advantageously maintains design information through at least in part automated transfer of selected portions of the design from design application 130, providing an integrated environment for design and design note-taking. Electronic notebook 140 is discussed in more detail with reference to the following Figures.

Figure 2:
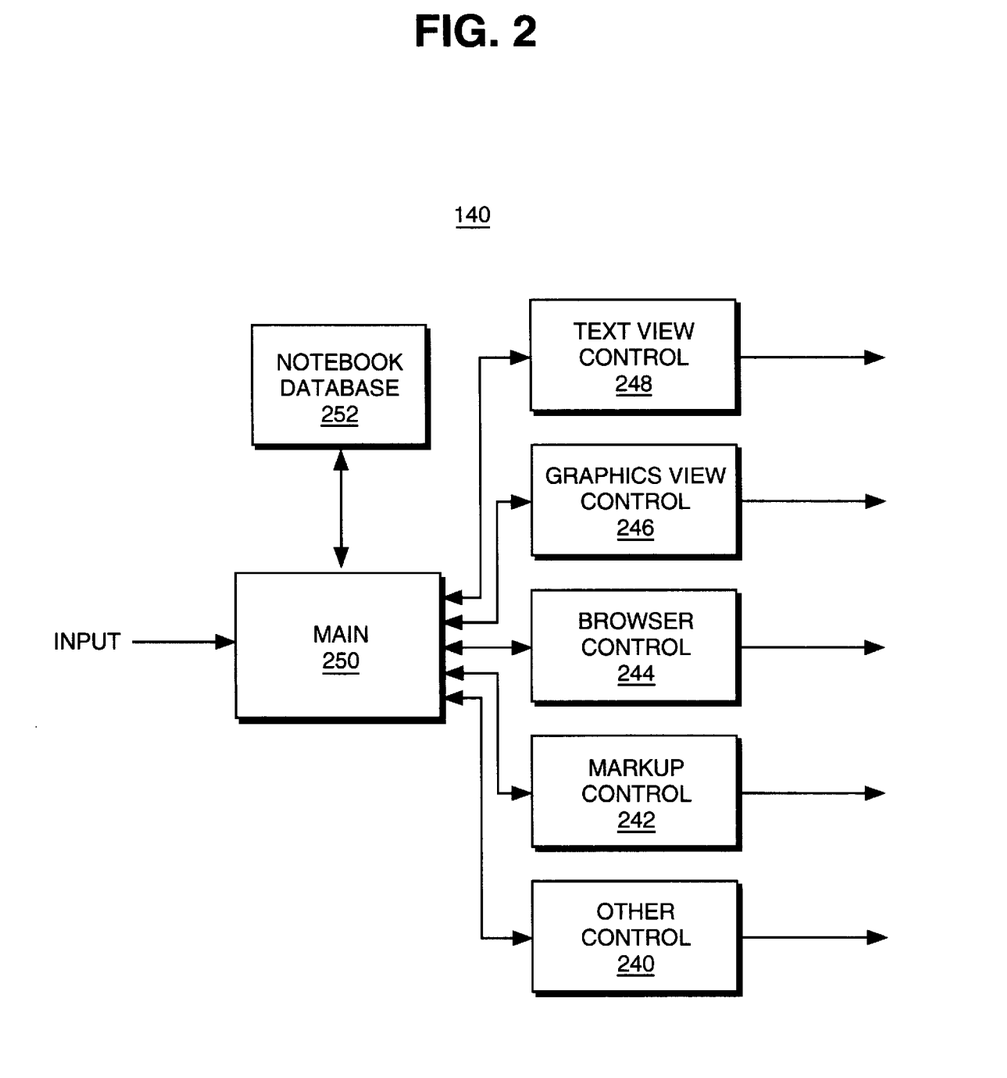
FIG. 2 is a block diagram illustrating an electronic notebook in more detail according to one embodiment of the present invention.

FIG. 2 is a block diagram illustrating electronic notebook 140 in more detail according to one embodiment of the present invention. As illustrated, electronic notebook 140 includes notebook database 252, main control logic 250, text view control logic 248, graphics view control logic 246, browser control logic 244, markup control logic 242, and "other" control logic 240. The operation of electronic notebook 140 will be discussed below with reference to the example displays of FIGS. 3 and 4.

Figure 3:
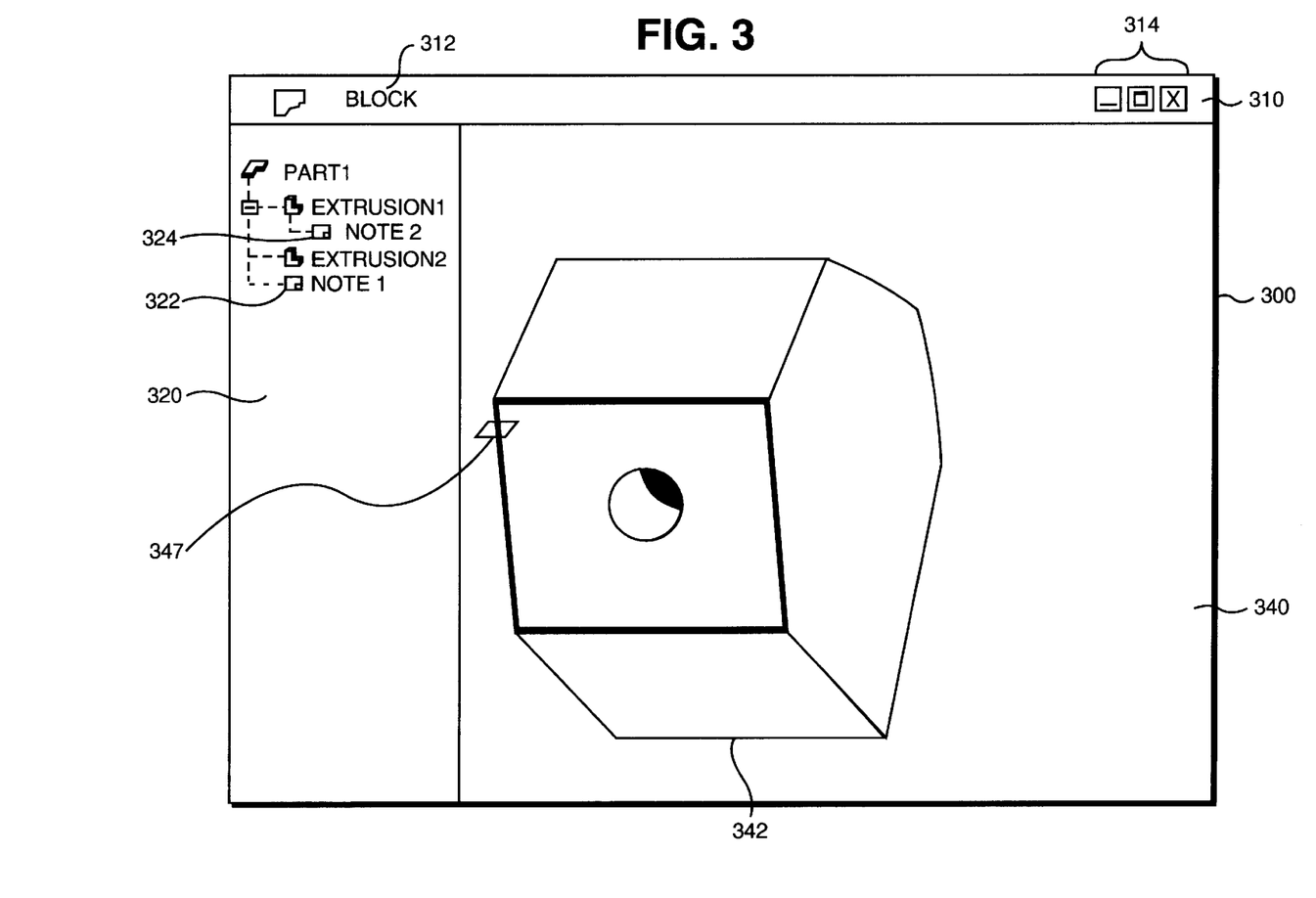
FIG. 3 illustrates an example display of a design such as may be used with one embodiment of the present invention.

FIG. 3 illustrates an example display of a design and accompanying information by design application 130 of FIG. 1a or 1b. A window 300 is illustrated including a title bar portion 310, a browser portion 320, and a graphics portion 340. Title bar portion 310 includes an identifier 312 of the design, ("block" as illustrated), as well as controls 314 for minimizing, maximizing, and closing the window 300. The use of such controls 314 are well known to those skilled in the art and thus will not be discussed further.

Browser portion 320 identifies different "pieces" of the design identified by identifier 312 which can be viewed by the user. Additionally, in one embodiment an identification of the notes from electronic notebook 140 which can be viewed by the user is also displayed in browser portion 320, such as notes 322 and 324. As will be appreciated by those skilled in the art, various features of the design 342 within graphics portion 340 can be selected by a user. Examples of such features include, faces, edges, combinations thereof (e.g., extrusions, holes), etc.

Figure 4:
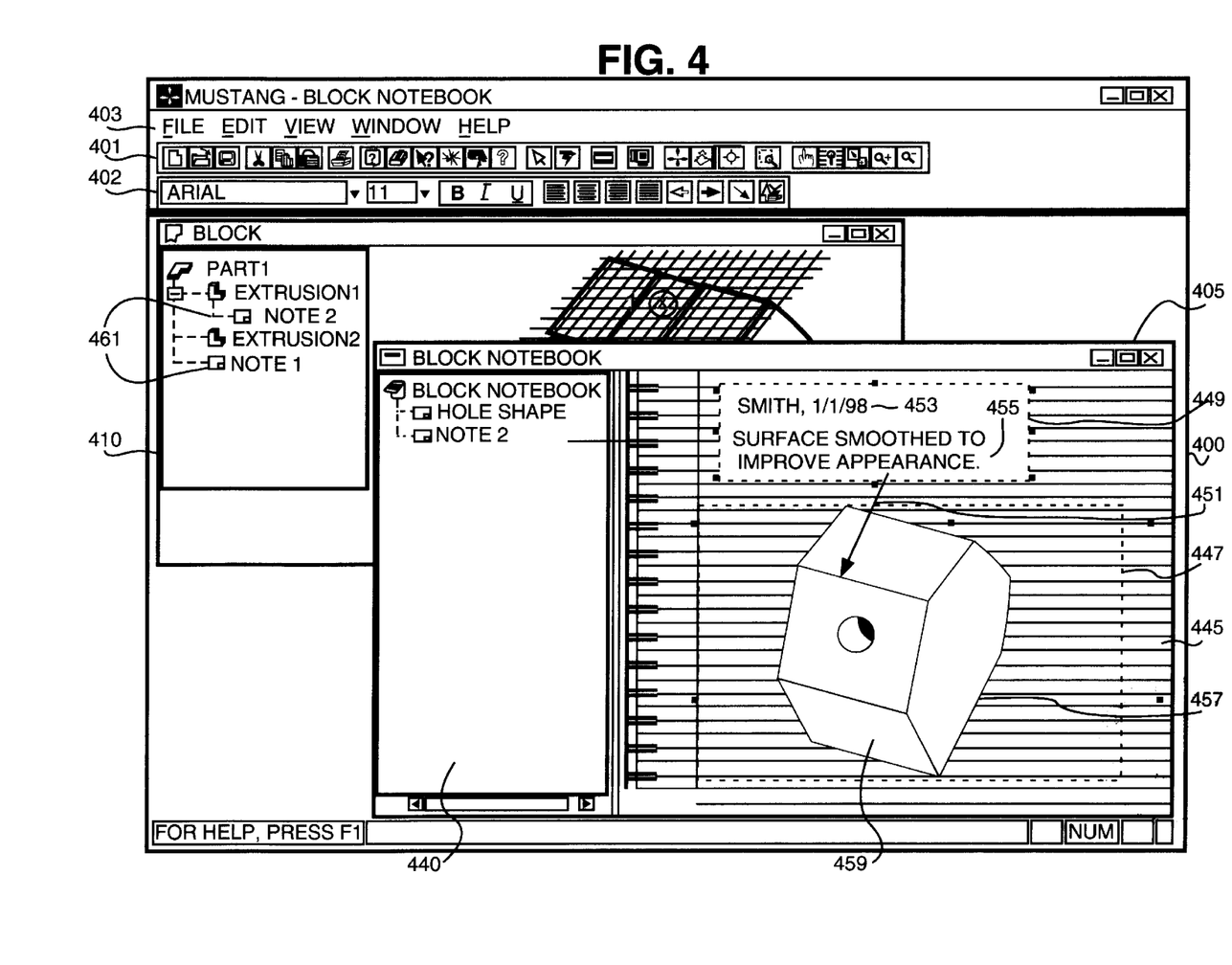
FIG. 4 illustrates an example display of a note within an electronic notebook according to one embodiment of the present invention.

FIG. 4 illustrates an example display of a note within an electronic notebook according to one embodiment of the present invention. As illustrated, a window 400 includes windows 405 and 410. Each of the windows 400, 405, and 410 includes a title bar with an identifier, as well as window controls to minimize, maximize, and close their respective windows. Additionally, window 400 includes a toolbar 401, format bar 402, and menu bar 403. Toolbar 401 includes various "tools", such as cut, paste, copy, print, save, help, etc. which can be selected by the user. Format bar 402 includes various text formatting and alignment options, such as font type, font size, bold, italics, underline, left justify, center, etc. which can be selected by the user. Menu bar 403 includes various command menus, such as file commands, editing commands, viewing options, etc. which can be selected by the user. The use of such "tools", menus, and text formatting/alignment options are well known to those skilled in the art and thus will not be discussed further except as they pertain to the present invention.

Window 405 includes a browser portion 440, and a note portion 445. In the illustrated implementation, note portion 445 is displayed to simulate a conventional spiral bound paper notebook. Note portion 445 includes a graphics portion 447, a text portion 449, and a "markup" 451.

Returning to FIG. 2, the notebook database 252 stores the note(s) of electronic notebook 140, such as note 445 of FIG. 4. Each of the notes within the database 252 can include any one or more of the following: text areas, graphics areas, markup areas, and "other" areas. Each of these areas is discussed in more detail below. In the illustrated embodiment, notebook database 252 is shown as being contained within electronic notebook 140. However, in alternate embodiments, notebook database 252 can be incorporated into, and thus be stored with, the design database(s) of design application 130.

Graphics view control logic 246 manages the display of a design, such as a design created by design application 130, within a note. During creation of the note, or the adding of additional graphics areas to a pre-existing note, graphics view control 246 manages the display of the current view of a design as well as any rotation of the design requested by the user. A view of the design object 342 of FIG. 3 is illustrated as object 457 in FIG. 4.

According to one embodiment of the present invention, during creation of the note 445, the object 457 can be rotated through multiple views to any one of a plurality of views. This rotation can be in one or more dimensions, and is three-dimensional in one implementation. Additionally, the object 457 can be manipulated in various other manners, including "zooming" in and out on the object, "panning" around the object, etc. The rotation and other manipulation of the object 457 can be accomplished in any of a wide variety of conventional manners based on any of a wide variety of conventional modeling techniques. Such modeling techniques are well-known to those skilled in the art and thus will not be discussed further except as they pertain to the present invention. The rotation may be indicated by a user in any of a wide variety of conventional manners, such as selection of a tool button from toolbar 401, selection of a menu item from menu bar 403, or selection of a menu item from a pull down menu when object 457 is selected (for example, by right "clicking" on a cursor control device while the cursor is "on top" of object 457).

According to one embodiment of the present invention a user "freezes" the current data of the object 342 and stores the "frozen" data in notebook database 252. This "frozen" or "snapshot" data is the data of the object 342 at the time it is frozen—subsequent changes to the object 342 by the user of design application 130 do not affect the object 457 of electronic notebook 140. The "frozen" data can be stored in notebook database 252 using any of a wide variety of conventional manners, such as in a vector format wherein each feature or part of the object 457 is identified by one or more vectors.

The frozen data can be further rotated and/or manipulated by the user (zoomed, etc.) so that a particular "primary" view of the object is being displayed. The primary view can be selected by the user in any of a wide variety of manners, such as by selection of a "save view" menu item when the object 457 is rotating, or by entering in specific degrees of rotation and zoom amounts (e.g., 50%, 200%, etc.). An identification of this primary view is then stored in notebook database 252 so that when the note is subsequently accessed (e.g., opened, printed, etc.), the primary view will be provided. It is to be appreciated, however, that a user can still rotate and/or otherwise manipulate the object after this primary view is selected.

It should be noted that multiple graphics areas can be included within a single note, and thus that multiple views of the same object can be frozen by a user within a single note. Thus, by way of example, a user could include two or more objects 457 in the note, each having different primary views and/or being different versions of the object 342. Thus, the history of a particular design can be advantageously tracked by the electronic notebook 140 storing different data for the same object over time, and allowing additional information (text, audio, video, etc.) to be added to help explain the history.

In the illustrated embodiment, a particular part of the object 457 is highlighted within the note 445. The particular part which is highlighted is the same feature or part of object 342 which was selected in design application 130 when the user indicated to create (or add to) the note. These parts can include any one or more faces, edges, vertices or combinations thereof (for example, holes or extrusions). In the example note 445 of FIG. 4, the face 459 of object 457 is highlighted. It is to be appreciated that this highlighting can be performed in any of a wide variety of conventional matters, including altering the appearance of the entire feature or an outline of the feature, by altering, for example, the color of such feature or outline. Thus, it can be seen that a note corresponds to an object, and can also correspond to a particular part of that object as indicated by the highlighting. In alternate embodiments of the present invention, graphics view control 246 allows a user to further highlight additional parts or features of object 457 within the note 445.

According to an alternate embodiment, the note includes dynamic rather than static data for display. Static data is "frozen" data as discussed above. Dynamic data, however, is updated by graphics view control 246 each time the note is accessed, or alternatively when a "refresh" selection is made by a user. In this alternate embodiment, notebook database 252 maintains a record of the location of the object 342 (e.g., a location of a data file describing the object and a name of the object within that file). In this embodiment, graphics view control 246 is programmed with the format in which the image is stored by design application 130, and thus is able to interpret the image's data file and properly display the image. Thus, whenever the note 445 is accessed, graphics view control 246 accesses the location of the object and retrieves a current version of the object 342. It should be noted that the location from which the object is retrieved can be local (e.g., on the same machine as the electronic notebook 140 is currently executing), or remote (e.g., over a network such as a local area network (LAN) or the Internet).

Text view control 248 manages the display of text areas of a note, both during creation of the note and during subsequent viewing of the note. Upon creation of a note, text view control 248 automatically enters into the note primary design information corresponding to the design. In the illustrated embodiment, this primary design information (information 453 of FIG. 4) includes an identifier of the user ("Smith") which created the current text area 449 as well as the date ("Jan. 1, 1998") on which the text area 449 was created. However, in alternate embodiments different primary design information, including text as well as other media (e.g., audio or video), can be entered. Additionally, text view control 248 allows a user to enter into the note secondary design information corresponding to the design. It is to be appreciated that, because this secondary design information is input by the user, the scope and content of the secondary design information can vary greatly. In the example of FIG. 4, secondary design information 455 is user-input text which describes why the identified surface of the product was designed in a particular way. Additionally, according to one embodiment of the present invention, text view control 248 provides various conventional text formatting options to the user. Examples of such text formatting include "red-lining" of deleted text and other representations of text editing, setting font size and type, bolding, italicizing, or otherwise highlighting sections of text, etc. In alternate embodiments of the present invention, either one or both of the primary design information and the secondary design information are optional.

Browser control 244 manages the display of note icons in browser portion 440 of FIG. 4, including control of the layout within the browser portion 440. Browser control 244 also provides a user with the ability to change names of notes, select particular notes for display (for example, by "double-clicking" on the notes), and reorganize the display of note icons on the display device (e.g., in a "drag and drop" manner).

According to one embodiment of the present invention, note identifiers as well as identifiers of the parts to which the notes correspond are provided to design application 130. This allows design application 130 to include the note identifiers in its own browser window, such as window 410 of FIG. 4. Selection (e.g., "double-clicking") on a note identifier within window 410 causes design application 130 to notify electronic notebook 140 of the selected note identifier, in response to which electronic notebook 140 displays the corresponding note. Thus, in this embodiment, two separate browsers (the browser provided by design application 130 and the browser provided by electronic notebook 140) are usable by the viewer to access the notes of electronic notebook 140.

"Other" control logic 240 manages the presentation of other areas of secondary information within a note. Such "other" areas are separate from the text area 449 and graphics area 447 and can include different types of media. Examples of such media provided in the "other" areas include: audio information, video information, data from other applications (for example, word processing documents or spreadsheets), etc. Data from other applications can be copied into the note, or alternatively a pointer to another file (e.g., a word processing file or a spreadsheet file) can be stored within the note and the file subsequently accessed by electronic notebook 140 when the note is accessed. It is to be appreciated that the manner in which such "other" media is provided is dependent on the particular medium. By way of example, video information may be displayed within another area of note 445, whereas audio information may be played when the note 445 is accessed, or alternatively when a particular "audio" icon (not shown) on the note 445 is displayed.

Markup control logic 242 manages the display of any "markups" within the note. As used herein, a "markup" refers to a connection between two or more text, graphics, or other areas of a note. According to one embodiment of the present convention, these connections are identified to a user as a visual or graphical connection in the note, such as arrow 451 of FIG. 4.

Main control 250 manages the interaction among text view control 248, graphics view control 246, browser control 244, markup control 242, "other" control 240, and notebook database 252. Main control 250 also maintains notebook database 252, adding new notes and modifying notes within database 252 as requested by the user. Main control 250 is also responsible for managing the coordinated display of the graphics sections, text sections, and other areas of a note. In other words, main control 250 controls where, within a note, each of the one or more possible text, graphics, and "other" areas is to be located.

According to one embodiment of the present invention, electronic notebook 140 is implemented in software. However, in alternate embodiments one or more portions of electronic notebook 140 can be implemented in hardware and/or firmware.

According to one embodiment of the present invention, electronic notebook 140 is a stand-alone application which executes independently of design application 130. Although, as discussed above, the electronic notebook 140 may obtain current view information regarding a design from the database(s) of design application 130, the two applications are nonetheless executed separately by operating system 110. Furthermore, it is to be appreciated that in embodiments which use static graphics areas, the notes within electronic notebook 140 can be viewed after their creation independently of the design application and its database(s). Thus, for example, a stand-alone electronic notebook 140 can be executed at another computer system which does not include design application 130.

According to another embodiment of the present invention, the electronic notebook 140 operates in conjunction with design application 130. In this embodiment, main control 250 receives input from design application 130 of the current object and current view of that object being displayed within window 300 of FIG. 3. Main control 250 accesses notebook database 252 to determine whether the electronic notebook 140 includes any notes corresponding to the object currently displayed by design application 130, and if so, which feature(s) of the objects have notes associated with them. The features with notes can be identified by determining which features of an object are highlighted within a note. If an object has a corresponding note, then a note "glyph" is displayed along with the object, such as "glyph" 347 of FIG. 3.

The design application 130 is then able to maintain a record of which feature(s) of an object have notes associated with them. According to one embodiment of the present invention, if the note corresponds to a particular feature of the object, then the "glyph" 347 is displayed on that particular feature. In this embodiment, the design application 130 maintains a record of which view orientations display the feature, and thus which view orientations should include the "glyph". In alternate embodiments, the "glyph" 347 is located in different screen locations, either "on top of" or separate from the object.

According to one embodiment, the "glyph" 347 is displayed along the edge or boundary of the selected part. In one implementation, the "glyph" 347 is displayed along the boundary of the part at the point having the greatest "xyz" value (corresponding to, for example, the largest sum of x, y, and z dimensions of the boundary). However, alternate implementations place the "glyph" 347 in other points along the boundary of the part.

Additionally, according to one embodiment of the present invention, design application 130 displays one or more areas of the note corresponding to a particular feature when the user places the cursor "on top" of the "glyph" for that feature. Design application 130 sends a request to main control 250 of FIG. 2 to retrieve the data from a particular area (e.g., the text area 518 data of FIG. 5) for the proper note. Design application 130 then displays the retrieved data on the screen for so long as the cursor is "on top" of that "glyph".

Additionally, in embodiments where electronic notebook 140 operates in conjunction with design application 130, identifiers of the notes stored in notebook database 252 can be displayed in a browser window of design application 130. For example, design application 130 can display the notes 461 in window 410 of FIG. 4, along with the part or object list of the design.

Figure 5:
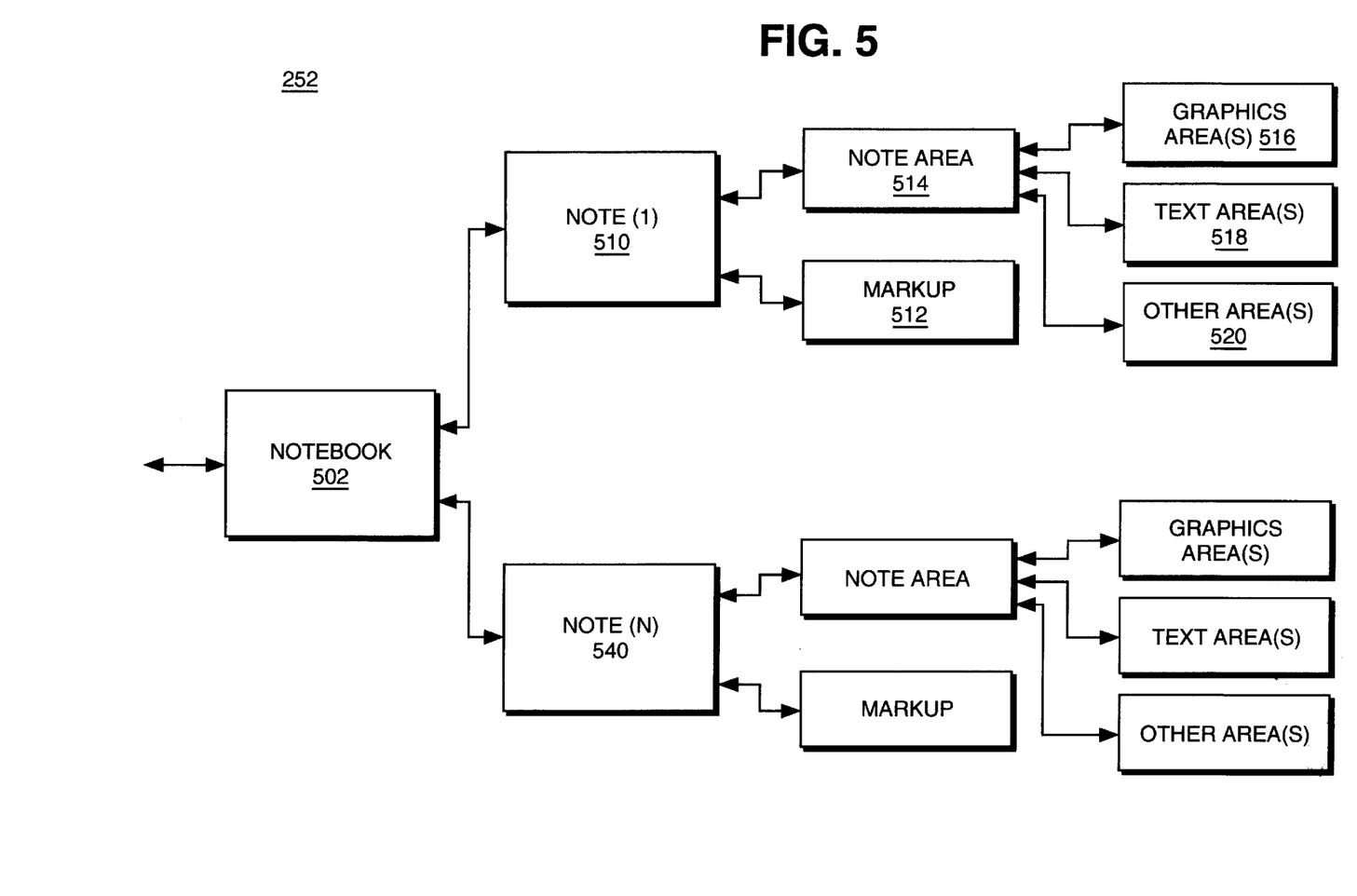
FIG. 5 illustrates an electronic notebook database according to one embodiment of the present invention.

FIG. 5 illustrates an electronic notebook database according to one embodiment of the present invention. In the illustrated embodiment, the database of FIG. 5 is database 252 of FIG. 2. Database 252 is illustrated as storing a single notebook 502. However, it is to be appreciated that in alternate embodiments, additional notebooks 502 corresponding to the same or different designs, or to different design applications, can be included within database 252.

As illustrated, notebook 502 includes multiple (N) notes 510 and 540. Note 510 includes markup data 512 and note area data 514. Markup data 512 includes data identifying one or more connections to be made between two or more of the areas of the note. Note area 514 includes data identifying the text, graphics, and "other" contents of the note, and is comprised of one or more graphics areas 516, text areas 518, and "other" areas 520.

Graphics areas 516 include data identifying the object data of a design, or a pointer to the object data of a design, to be displayed within the note by graphics view control 246 of FIG. 2. An indication of the "primary" view of the object is also stored in graphics areas 516. Graphics areas 516 also include selected formatting options, such as a particular feature being highlighted. It should be noted that one or more graphics areas 516 can be included within a single note 510, thereby allowing the history of a particular object's development to be tracked in a single note.

Similarly, text areas 518 store the primary and/or secondary design information to be provided in the note by text view control 248. Text areas 518 also store various formatting options for the primary and secondary design information. It is to be appreciated that multiple text areas 518 can exist within a single note.

The "other" areas 520 store data identifying various other secondary information which can be provided in the note by "other" control 240 of FIG. 2. Examples of such "other" secondary information include audio data (for example, ".wav" files), video data (for example, JPEG files), as well as other "text" files (for example, word processing documents, the spreadsheet documents, etc.). The actual data for these "other" types of files may be stored within "other" areas 520, or alternatively an identifier of where the data can be located (e.g., a filename and path) may be stored within "other" areas 520. It is to be appreciated that multiple "other" areas 520 can be included within a single note 510.

Similar data storage areas exist within note 540, as illustrated in FIG. 5.

It is to be appreciated that the notebook database 252 can be implemented using any of a wide variety of conventional data structures. By way of example, database 252 can be implemented using linked lists and/or arrays.

According to one embodiment of the present invention, the object 457 of FIG. 4 is stored by electronic notebook 140 using substantially the same data structure as is used by design application 130 to store object 342 of FIG. 3. However, in an alternate embodiment, electronic notebook 140 uses a different data structure and translates between the two data structures as necessary.

Additionally, according to one embodiment of the present invention electronic notebook 140 uses substantially the same data rotation and/or manipulation processes as are employed by application 130 to rotate and/or manipulate the data. However, in alternate embodiments, different data rotation and/or manipulation processes are used by electronic notebook 140.

Figure 6:
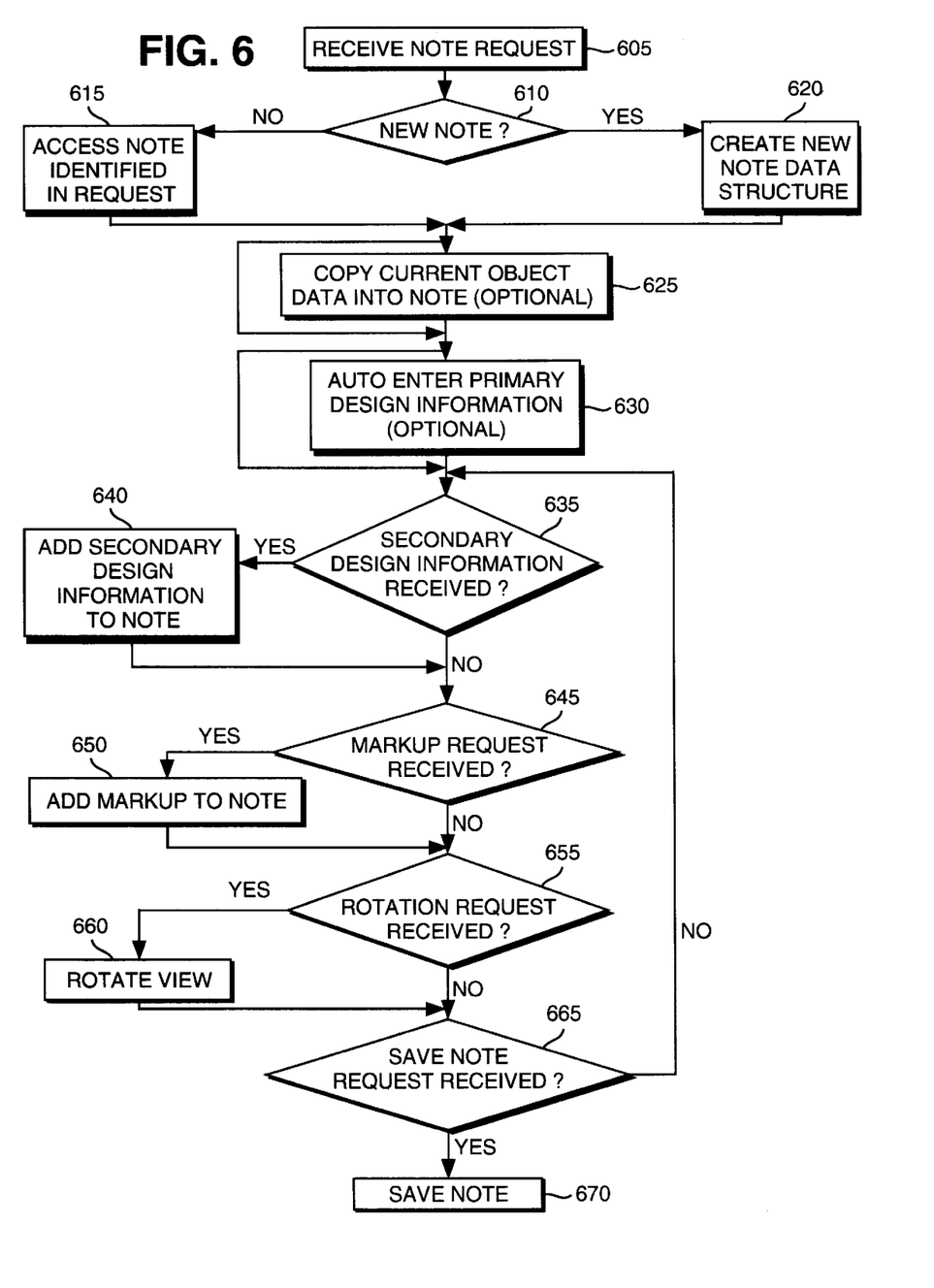
FIG. 6 is a flowchart illustrating the steps followed in adding information to a note of an electronic notebook according to one embodiment of the present invention.

FIG. 6 is a flowchart illustrating the steps followed in adding information to a note of an electronic notebook according to one embodiment of the present invention. As illustrated, a note request is received by main control 250 of FIG. 2, step 605. The note request is a request to add note information for any one or more areas (e.g., text, graphics, or "other" areas, or a markup) corresponding to an object. The request includes an indication of which feature of design 342, if any, was selected when the request was made. In the illustrated embodiment, the request is made by a user in any of a wide variety of conventional manners (e.g., selecting a "new note" or "modify note" command from a pull down menu when "clicking" on a feature of the design 342).

Upon receipt of the request, main control 250 checks whether it is a request for a new note, step 610. If it is not a request to create a new note, then main control 250 accesses the note identified in the request in notebook database 252, step 615. Main control 250 then proceeds to step 625. However, if the request is a request for a new note, then main control 250 creates a new note data structure 620, then proceeds to step 625.

In step 625, main control 250 copies the current object data into the note identified by the request (either the newly created or the accessed note). Main control 250 then automatically enters primary design information (e.g., an identifier of the user that made the request and the date on which the request is made), step 630. As illustrated in FIG. 6, both steps 625 and 630 are optional. Thus, in alternate embodiments, the current drawing need not be copied into the note in step 625 and the primary design information need not be copied into the note in step 630.

Main control 250 then checks whether secondary design information has been received from the user, step 635. If secondary design information has been received then main control 250 stores the secondary design information as part of the note in database 252, step 640.

Processing then continues from step 635 or step 640 to step 645, where main control 250 checks whether a markup request has been received. If a markup request has been received then main control 250 stores the markup as part of the note in database 252, step 650.

Processing then continues from step 645 or step 650 to step 655, where main control checks whether a rotation request is received from the user. If a rotation request has been received, then main control 250 forwards the request to graphics view control 246 to rotate the object in the requested manner, step 660.

Processing then continues from step 655 or step 660 to step 665, where main control checks whether a "save" note request has been received, step 665. Main control 250 continues to update the note with new secondary design information, markup information, and rotation changes, steps 635–665, until a "save" note request is received. The "save" note request indicates that the user is finished entering data to the note for the present time. Thus, main control 250 saves the note in response to the "save" note request, step 670, including an indication of the view being displayed when the "save" note request was received (which is stored as the primary view). However, it is to be appreciated that the user is able to add additional information to the note at a later time by requesting to modify the note (step 605).

Figure 7:
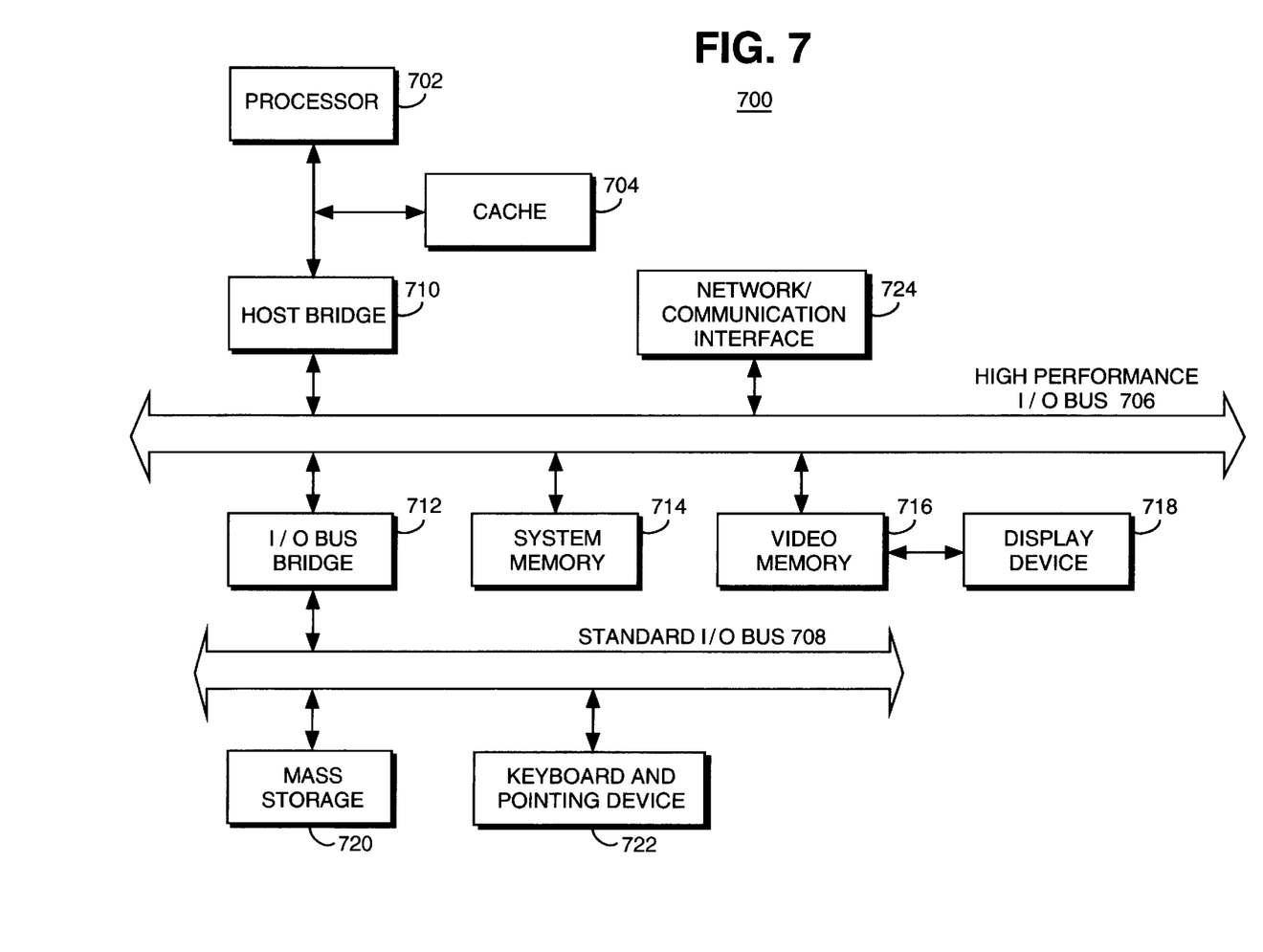
FIG. 7 illustrates an example hardware system suitable for use with one embodiment of the present invention.

FIG. 7 illustrates an example hardware system or machine suitable for use with one embodiment of the present invention. Hardware system 700 includes processor 702 and cache memory 704 coupled to each other as shown. Additionally, hardware system 700 includes high performance input/output (I/O) bus 706 and standard I/O bus 708. Host bridge 710 couples processor 702 to high performance I/O bus 706, whereas I/O bus bridge 712 couples the two buses 706 and 708 to each other. Coupled to bus 706 are network/communication interface 724, system memory 714, and video memory 716. In turn, display device 718 is coupled to video memory 716. Coupled to bus 708 is mass storage 720, keyboard and pointing device 722, and I/O ports 726. Collectively, these elements are intended to represent a broad category of hardware systems, including but not limited to general purpose computer systems based on processors available from Intel Corporation of Santa Clara, Calif., from Advance Micro Devices (AMD) of Sunnyvale, Calif., from National Semiconductor of Sunnyvale, Calif., or from Digital Equipment Corporation (DEC) of Maynard, Mass.

These elements 702–724 perform their conventional functions known in the art. In particular, network/communication interface 724 is used to provide communication between system 700 and any of a wide range of conventional networks, such as an Ethernet, token ring, the Internet, etc. It is to be appreciated that the circuitry of interface 724 is dependent on the type of network the system 700 is being coupled to.

Mass storage 720 is used to provide permanent storage for the data and programming instructions to implement the above described functions, whereas system memory 714 is used to provide temporary storage for the data and programming instructions when executed by processor 702. I/O ports 726 are one or more serial and/or parallel communication ports used to provide communication between additional peripheral devices which may be coupled to hardware system 700.

It is to be appreciated that various components of hardware system 700 may be rearranged. For example, cache 704 may be on-chip with processor 702. Alternatively, cache 704 and processor 702 may be packed together as a "processor module", with processor 702 being referred to as the "processor core". Furthermore, certain implementations of the present invention may not require nor include all of the above components. For example, mass storage 720, keyboard and pointing device 722, and/or display device 718 and video memory 716 may not be included in system 700. Additionally, the peripheral devices shown coupled to standard I/O bus 708 may be coupled to high performance I/O bus 706; in addition, in some implementations only a single bus may exist with the components of hardware system 700 being coupled to the single bus. Furthermore, additional components may be included in system 700, such as additional processors, storage devices, or memories.

In one embodiment, the electronic notebook according to the present invention as discussed above is implemented as a series of software routines run by hardware system 700 of FIG. 7. In this embodiment, main control 250, text view control 248, graphics view control 246, browser control 244, markup control 242, and "other" control 240 of FIG. 2 are each implemented as a series of software routines. These software routines comprise a plurality or series of instructions to be executed by a processor in a hardware system, such as processor 702 of FIG. 7. Initially, the series of instructions are stored on a storage device, such as mass storage 720. It is to be appreciated that the series of instructions can be stored using any conventional storage medium, such as a diskette, CD-ROM, magnetic tape, DVD, laser disk, ROM, Flash memory, etc. It is also to be appreciated that the series of instructions need not be stored locally, and could be received from a remote storage device, such as a server on a network, via network/communication interface 724. The instructions are copied from the storage device, such as mass storage 720, into memory 714 and then accessed and executed by processor 702. In one implementation, these software routines are written in the C++ programming language. It is to be appreciated, however, that these routines may be implemented in any of a wide variety of programming languages.

In alternate embodiments, the present invention is implemented in discrete hardware or firmware. For example, one or more application specific integrated circuits (ASICs) could be programmed with the above described functions of the present invention. By way of another example, main control 250, text view control 248, graphics view control 246, browser control 244, markup control 242, and "other" control 240 of FIG. 2 could be implemented in one or more ASICs of an additional circuit board for insertion into hardware system 700 of FIG. 7.

It is to be appreciated that although specific examples of primary and secondary design information, as well as information which can be stored in an "other" area, are discussed above, alternate embodiments of the present invention store different data. Examples of such data include: a user's intentions in making a design change; the history of the design, such as various modifications which were decided against or later changed and the reasoning behind such decisions or changes; assembly instructions (either for a manufacturer or an end user), etc.

Thus, the present invention provides an integrated environment for design and design note-taking. The electronic notebook of the present invention advantageously maintains the design information independent of the design itself, copying over the portions of the design it needs in one embodiment, thereby allowing the electronic notebook to be used and viewed independently of the actual design application which created the design. Furthermore, the electronic notebook advantageously allows a user to maintain design intent and design history throughout the development and manufacturing of the design, as well as other information if desired, for the design.

Thus, an electronic notebook for maintaining design information has been described. Whereas many alterations and modifications of the present invention will be comprehended by a person skilled in the art after having read the foregoing description, it is to be understood that the particular embodiments shown and described by way of illustration are in no way intended to be considered limiting. References to details of particular embodiments are not intended to limit the scope of the claims.

What is claimed is:

1. A method comprising:

receiving a request to add note information to a graphical representation of a design notebook corresponding to a design; and automatically copying at least a portion of the design to a note of the graphical representation of the design notebook, in response to the request, wherein the note includes snapshot data of a developmental stage of the design at a time when the request is received, said snapshot data being manipulable.

2. The method of claim 1, further comprising:
automatically adding to the note, in response to the request, primary design information corresponding to the design.

3. The method of claim 2, wherein the primary design information includes a current date and an identifier of a current user of the design.

4. The method of claim 1, further comprising:
receiving secondary design information corresponding to the design; and
adding the secondary design information to the note.

5. The method of claim 4, wherein the secondary design information comprises one or more of audio data, video data, and text data.

6. The method of claim 4, further comprising:
creating a graphical representation of a correspondence between the secondary design information and a feature of the design.

7. The method of claim 1, further comprising:
rotating the at least a portion of the design through a plurality of views;
allowing a user to select one of the plurality of views; and
adding the selected view to the note as the design.

8. The method of claim 7, further comprising:
receiving a second request to add note information corresponding to the design;
automatically copying to the graphical representation of the design notebook, in response to the second request, at least a second portion of the design;
rotating, independently of the rotating of the at least a portion of the design, the at least a second portion of the design through a plurality of views of the at least a second portion;
allowing a user to select one of the plurality of views of the at least a second portion; and
adding the selected view of the at least a second portion to the note.

9. The method of claim 1, wherein the copying comprises adding a dynamic design to the note, and further comprising:
accessing the design to obtain a current version of the design each time the note is accessed.

10. The method of claim 1, further comprising:
tracking design history by automatically copying a plurality of portions of the design to the note of the graphical representation of the design notebook over a period of time, each of the plurality of portions being from a different point in time.

11. A machine-readable medium having stored thereon a plurality of instructions, designed to be executed by a processor, for implementing a function for receiving a request to add note information to a graphical representation of a design notebook corresponding to a design, and for automatically copying at least a portion of the design to a note of the graphical representation of the design notebook, in response to the request, wherein the note includes snapshot data of a developmental stage of the design at a time when the request is received, said snapshot data being manipulable.

12. The machine-readable medium of claim 11, wherein the plurality of instructions are further for implementing a function for automatically adding to the note, in response to the request, primary design information corresponding to the design.

13. The machine-readable medium of claim 12, wherein the primary design information includes a current date and an identifier of a current user of the design.

14. The machine-readable medium of claim 11, wherein the plurality of instructions are further for implementing a function for receiving secondary design information corresponding to the design, and for adding the secondary design information to the note.

15. The machine-readable medium of claim 14, wherein the secondary design information comprises one or more of audio data, video data, and text data.

16. The machine-readable medium of claim 14, wherein the plurality of instructions are further for implementing a function for creating a graphical representation of a correspondence between the secondary design information and a feature of the design.

17. The machine-readable medium of claim 11, wherein the plurality of instructions are further for implementing a function for rotating the at least a portion of the design through a plurality of views, allowing a user to select one of the plurality of views, and adding the selected view to the note as the design.

18. The machine-readable medium of claim 17, wherein the plurality of instructions are further for implementing a function for receiving a second request to add note information corresponding to the design, automatically copying, in response to the second request, at least a second portion of the design to the note of the graphical representation of the design notebook, rotating, independently of the rotating of the at least a portion of the design, the at least a second portion of the design through a plurality of views of the at least a second portion, allowing a user to select one of the plurality of views of the at least a second portion, and adding the selected view of the at least a second portion to the note.

19. The machine-readable medium of claim 11, wherein the copying comprises adding a dynamic design to the note, and wherein the plurality of instructions are further for implementing a function for accessing the design to obtain a current version of the design each time the note is accessed.

20. The machine-readable medium of claim 11, wherein the plurality of instructions are further for implementing a function for tracking design history by automatically copying a plurality of portions of the design to the note of the graphical representation of the design notebook over a period of time, each of the plurality of portions being from a different point in time.

21. An apparatus comprising:
a machine-readable medium having stored thereon a plurality of instructions, designed to be executed, for implementing a function for receiving a request to add note information to a graphical representation of a design notebook corresponding to a design, and for automatically copying at least a portion of the design to a note of the graphical representation of the design notebook, in response to the request, wherein the note includes snapshot data of a developmental stage of the design at a time when the request is received, said snapshot data being manipulable; and
a processor to execute the plurality of instructions.

22. The apparatus of claim 21, wherein the plurality of instructions are further for implementing a function for automatically adding to the note, in response to the request, primary design information corresponding to the design.

23. The apparatus of claim 22, wherein the primary design information includes a current date and an identifier of a current user of the design.

24. The apparatus of claim 21, wherein the plurality of instructions are further for implementing a function for receiving secondary design information corresponding to the design, and for adding the secondary design information to the note.

25. The apparatus of claim 24, wherein the secondary design information comprises one or more of audio data, video data, and text data.

26. The apparatus of claim 24, wherein the plurality of instructions are further for implementing a function for creating a graphical representation of a correspondence between the secondary design information and a feature of the design.

27. The apparatus of claim 21, wherein the plurality of instructions are further for implementing a function for rotating at least a portion of the design through a plurality of views, allowing a user to select one of the plurality of views, and adding the selected view to the note as the design.

28. The apparatus of claim 27, wherein the plurality of instructions are further for implementing a function for receiving a second request to add note information corresponding to the design, automatically copying, in response to the second request, at least a second portion of the design to the note of the graphical representation of the design notebook, rotating, independently of the rotating of the at least a portion of the design, the at least a second portion of the design through a plurality of views of the at least a second portion, allowing a user to select one of the plurality of views of the at least a second portion, and adding the selected view of the at least a second portion to the note.

29. The apparatus of claim 21, wherein the copying comprises adding a dynamic design to the note, and wherein the plurality of instructions are further for implementing a function for accessing the design to obtain a current version of the design each time the note is accessed.

30. The apparatus of claim 21, wherein the plurality of instructions are further for implementing a function for tracking design history by automatically copying a plurality of portions of the design to the note of the graphical representation of the design notebook over a period of time, each of the plurality of portions being from a different point in time.

* * * * *